(12) United States Patent
Oosawa et al.

(10) Patent No.: US 9,590,042 B2
(45) Date of Patent: Mar. 7, 2017

(54) SEMICONDUCTOR DEVICE AND METHOD FOR MANUFACTURING THE SAME

(71) Applicant: DENSO CORPORATION, Kariya, Aichi-pref. (JP)

(72) Inventors: Seigo Oosawa, Nukata-gun (JP);
Yutaka Tomatsu, Okazaki (JP);
Masahiro Ogino, Nukata-gun (JP);
Tomomi Oobayashi, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/759,823

(22) PCT Filed: Dec. 23, 2013

(86) PCT No.: PCT/JP2013/007520
§ 371 (c)(1),
(2) Date: Jul. 8, 2015

(87) PCT Pub. No.: WO2014/112015
PCT Pub. Date: Jul. 24, 2014

(65) Prior Publication Data
US 2015/0372090 A1    Dec. 24, 2015

(30) Foreign Application Priority Data

Jan. 17, 2013  (JP) ................................ 2013-006598
Oct. 31, 2013  (JP) ................................ 2013-226352

(51) Int. Cl.
*H01L 29/10*      (2006.01)
*H01L 29/78*      (2006.01)
(Continued)

(52) U.S. Cl.
CPC ........ *H01L 29/1095* (2013.01); *H01L 29/086* (2013.01); *H01L 29/41766* (2013.01);
(Continued)

(58) Field of Classification Search
CPC ......... H01L 29/66734; H01L 29/66712; H01L 29/7802; H01L 29/7813
See application file for complete search history.

(56) References Cited

U.S. PATENT DOCUMENTS

2002/0130359 A1    9/2002  Okumura et al.
2003/0075759 A1*   4/2003  Kawano ............. H01L 29/7813
                                                    257/330
(Continued)

FOREIGN PATENT DOCUMENTS

JP      04-113655 A    4/1992
JP     2000-223708 A   8/2000
(Continued)

OTHER PUBLICATIONS

International Search Report and Written Opinion dated Mar. 25, 2014 in the corresponding International Application No. PCT/JP2013/007520 (with English translation).
(Continued)

*Primary Examiner* — Dale E Page
*Assistant Examiner* — John Bodnar
(74) *Attorney, Agent, or Firm* — Posz Law Group, PLC

(57) ABSTRACT

In a semiconductor device, a first conductivity-type first semiconductor region that abuts on a side surface of a contact trench adjacent to an opening portion of the contact trench, and has a higher impurity concentration than that of a second semiconductor layer is formed. Also, a second conductivity-type second semiconductor region that abuts on a bottom surface of the contact trench and a side surface of the contact trench adjacent to the bottom surface of the contact trench, and has a higher impurity concentration than that of a first semiconductor layer is formed. A first electrode that is connected electrically with the first semiconductor region and the second semiconductor region is disposed in the contact trench. Even when the semiconductor device is
(Continued)

CREEP-UP HEIGHT OF
BASE CONTACT REGION y miniaturized by reducing the width of the contact trench, a breakage of the semiconductor device when switched from an on-state to an off-state is reduced.

6 Claims, 11 Drawing Sheets

(51) Int. Cl.
*H01L 29/66* (2006.01)
*H01L 29/423* (2006.01)
*H01L 29/417* (2006.01)
*H01L 29/08* (2006.01)
*H01L 29/06* (2006.01)
*H01L 29/739* (2006.01)

(52) U.S. Cl.
CPC .... *H01L 29/4238* (2013.01); *H01L 29/66712* (2013.01); *H01L 29/66734* (2013.01); *H01L 29/78* (2013.01); *H01L 29/7802* (2013.01); *H01L 29/7813* (2013.01); *H01L 29/0634* (2013.01); *H01L 29/6634* (2013.01); *H01L 29/66348* (2013.01); *H01L 29/7397* (2013.01)

(56) References Cited

U.S. PATENT DOCUMENTS

| | | |
|---|---|---|
| 2003/0089966 A1 | 5/2003 | Hattori et al. |
| 2004/0007766 A1 | 1/2004 | Nakayama et al. |
| 2004/0021174 A1* | 2/2004 | Kobayashi .......... H01L 29/7813 257/330 |
| 2006/0141739 A1 | 6/2006 | Poelzl |
| 2006/0226475 A1 | 10/2006 | Yamamoto et al. |
| 2006/0292805 A1 | 12/2006 | Kawamura et al. |
| 2007/0023828 A1 | 2/2007 | Kawamura et al. |
| 2011/0233663 A1 | 9/2011 | Hamada et al. |
| 2012/0211831 A1* | 8/2012 | Hsieh .............. H01L 21/823481 257/334 |

FOREIGN PATENT DOCUMENTS

| | | | | |
|---|---|---|---|---|
| JP | 2001-284587 A | | 10/2001 | |
| JP | 2001-345445 A | | 12/2001 | |
| JP | 2002-016080 A | | 1/2002 | |
| JP | 2002-353452 A | | 12/2002 | |
| JP | 2003-101019 A | | 4/2003 | |
| JP | 2003-101027 A | | 4/2003 | |
| JP | 2003-174167 A | | 6/2003 | |
| JP | 2003174167 A | * | 6/2003 | ............. H01L 29/78 |
| JP | 2003-298055 A | | 10/2003 | |
| JP | 2005-183547 A | | 7/2005 | |
| JP | 2006-059940 A | | 3/2006 | |
| JP | 2006-120894 A | | 5/2006 | |
| JP | 2006-140239 A | | 6/2006 | |
| JP | 2009-043966 A | | 2/2009 | |
| JP | 2012-199468 A | | 10/2012 | |

OTHER PUBLICATIONS

Notification of Reason for Refusal dated Jan. 27, 2015 in the corresponding JP Application No. 2013-226352 (with English translation).

Decision of Refusal dated Apr. 28, 2015 in the corresponding JP Application No. 2013-226352 (with English translation).

* cited by examiner

CREEP-UP HEIGHT OF
BASE CONTACT REGION y

SEMICONDUCTOR DEVICE AND METHOD FOR MANUFACTURING THE SAME

CROSS REFERENCE TO RELATED APPLICATIONS

This application a U.S. national stage application of PCT/JP2013/007520 filed on Dec. 23, 2013 and is based on Japanese Patent Applications No. 2013-6598 filed on Jan. 17, 2013 and No. 2013-226352 filed on Oct. 31, 2013, the disclosures of which are incorporated herein by reference.

TECHNICAL FIELD

The present disclosure relates to a semiconductor device having a contact trench and a method for manufacturing the same.

BACKGROUND ART

A semiconductor device with a trench gate MOSFET (Metal Oxide Semiconductor Field Effect Transistor) has been proposed. (For example, see patent literature 1.)

Specifically, in the semiconductor device, a P-type base layer is formed in a surface layer portion of an $N^-$-type drift layer. Plural gate trenches are formed to pass through the base layer and reach the drift layer. A gate insulation film and a gate electrode are formed on a wall surface of each gate trench. An $N^+$-type source layer is formed in a surface layer portion of the base layer to abut on a side surface of the gate trench.

A contact trench is formed between adjacent gate trenches to reach the base layer. An $N^{++}$-type source contact region that has a higher impurity concentration than that of the source layer is formed to abut only on a side surface of the contact trench adjacent to an opening portion of the contact trench. A $P^+$-type base contact region that has a higher impurity concentration than that of the base layer is formed to abut only on a bottom surface of the contact trench.

A source electrode is implanted in the contact trench and connected electrically with the source layer, the source contact region, the base layer and the base contact region. A drain electrode is formed adjacent to a rear surface of the drift layer.

PRIOR ART LITERATURE

Patent Literature

Patent Literature 1: JP 2003-92405A

SUMMARY OF INVENTION

Recently, miniaturization of semiconductor devices is demanded. For example, it is considered to reduce a width of a contact trench to miniaturize the semiconductor device. In the semiconductor device, however, reducing the width of the contact trench for the miniaturization of the semiconductor device results in narrowing the base contact region, which abuts only on the bottom surface of the contact trench. Therefore, the semiconductor device will be easily broken when switched from an on-state to an off-state.

That is, in the semiconductor device, a parasitic bipolar transistor is formed by the source layer and the source contact region, the base layer and the base contact region, and the drift layer. If the semiconductor device connected to a load, such as a motor or a coil, which has an inductance is switched from the on-state to the off-state, a back electromotive force occurs and a diode that is formed between the drift layer and the base layer becomes a reverse bias state. Therefore, a breakdown occurs in a region near the trench gate where electric fields are concentrated, and an electric current flows. In this case, the electric current (carriers) flows from the breakdown region to the source electrode through the base contact region. If the base contact region is small, the electric current (carriers) hardly flows from the base contact region to the source electrode. That is, if the semiconductor device is miniaturized by reducing the width of the contact trench, a resistance (voltage drop) in the base layer will increase, and the parasitic bipolar transistor will be easily turned on. Because the parasitic bipolar transistor is turned on, the semiconductor device will be easily broken.

This matter occurs in not only a semiconductor device with the trench gate MOSFET, but also a semiconductor device with a trench gate IGBT (Insulated Gate Bipolar Transistor), for example. This matter also occurs in not only the trench gate semiconductor device but also a planar semiconductor device. This is because a small base contact region makes the electric current (carriers) difficult to flow from the base contact region to the source electrode when the semiconductor device is switched from the on-state to the off-state.

It is an object of the present disclosure to provide a semiconductor device that can restrict a breakage when switched from an on-state to an off-state even when the semiconductor device is miniaturized by reducing the width of a contact trench, and a method for manufacturing the semiconductor device.

According to a first aspect of the present disclosure, a semiconductor device includes: a first conductivity-type drift layer; a second conductivity-type first semiconductor layer disposed in a surface layer portion of the drift layer; a first conductivity-type second semiconductor layer disposed in a surface layer portion of the first semiconductor layer; a contact trench formed in the second semiconductor layer, a first conductivity-type first semiconductor region that has a higher impurity concentration than that of the second semiconductor layer and abuts on a side surface of the contact trench adjacent to an opening portion of the contact trench; a second conductivity-type second semiconductor region that has a higher impurity concentration than that of the first semiconductor layer and abuts on a bottom surface of the contact trench and the side surface of the contact trench adjacent to the bottom surface of the contact trench; a first electrode that is disposed in the contact trench and connected electrically with the first semiconductor region and the second semiconductor region; and a second electrode that is connected electrically with a region different from a region to which the first electrode is electrically connected and allows a current to flow between the first electrode and the second electrode.

Accordingly, even when the semiconductor device is miniaturized by reducing the width of the contact trench, a size of the second semiconductor region formed at the side surface of the contact trench is not changed. That is, the size of the second semiconductor region can be secured even when the semiconductor device is miniaturized. Therefore, when the semiconductor device is changed from an on-state to an off-state and a breakdown occurs, the current easily flows into the second semiconductor region and hence an increase of the resistance (voltage drop) in the first semiconductor layer is restricted. As a result, it is less likely that the parasitic bipolar transistor will be turned on and the semiconductor device will be broken.

According to a second aspect of the present disclosure, in the semiconductor device as in the first aspect, the first semiconductor region abuts on the second semiconductor region.

In this case, a contact resistance can be lowered, as compared to the case where the first electrode (the wall surface of the contact trench) is in contact with the first semiconductor layer and the second semiconductor layer. The contact trench needs not to be deepen in order to increase the contact area with the first electrode because the contact resistance with the first electrode can be lowered. Therefore, it is less likely that a depletion layer between the drift layer and the first semiconductor layer will reach the contact trench and a voltage resistance will decrease.

According to a third aspect of the present disclosure, in the semiconductor device as in the first aspect, a junction position between the first semiconductor region and the second semiconductor region is shallower than a junction position between the first semiconductor layer and the second semiconductor layer.

According to a fourth aspect of the present disclosure, in the semiconductor device as in the first aspect, a junction position between the first semiconductor region and the second semiconductor region is deeper than a junction position between the first semiconductor layer and the second semiconductor layer.

In the semiconductor device as in the third aspect, since the second semiconductor region is enlarged, a breakage of the semiconductor device is further restricted. Since the contact trench is reduced in depth, the first electrode can be implanted easily. In the semiconductor device as in the fourth aspect, since the first semiconductor region is enlarged, the breakdown of the semiconductor device is restricted and an on-state resistance can be reduced.

A method according to an aspect of the present disclosure relates to a method for manufacturing a semiconductor device in which a first semiconductor region and a second semiconductor region abut on each other.

The method for manufacturing the semiconductor device includes: forming a first semiconductor layer adjacent to a surface of a semiconductor substrate that has the surface and the other surface opposite to the surface and constitutes a drift layer; forming a second semiconductor layer in a surface layer portion of the first semiconductor layer; forming a mask on the surface of the semiconductor substrate and forming an opening portion in the mask by patterning the mask to expose a region of the surface of the semiconductor substrate in which a contact trench is to be formed; forming a first semiconductor region diffusing under the mask by ion-implanting a first conductivity-type impurity from the surface of the semiconductor substrate using the mask and conducting a thermal diffusion; forming a contact trench that passes through the first semiconductor region using the mask; and forming a second semiconductor region that abuts on a bottom surface of the contact trench, a side surface of the contact trench adjacent to the bottom surface of the contact trench and the first semiconductor region by ion-implanting a second conductivity-type impurity with a dosage smaller than that of the forming of the first semiconductor region and conducting the thermal diffusion.

The semiconductor device in which the first semiconductor region and the second semiconductor region abut on each other can be manufactured by ion-implanting the second conductivity-type impurity with the dosage smaller than that of the case of forming the first semiconductor region and conducting the thermal diffusion when the second semiconductor region is formed.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Embodiments of the present disclosure will be described hereinafter with reference to the drawings. Same or equivalent parts will be designated with the same symbols in the embodiments described hereinafter.

(First Embodiment)

A first embodiment of the present disclosure will be described hereinafter with reference to the drawings. In the present embodiment, an example in which the present disclosure is employed to an n-channel-type MOSFET will be described.

Figure 1:
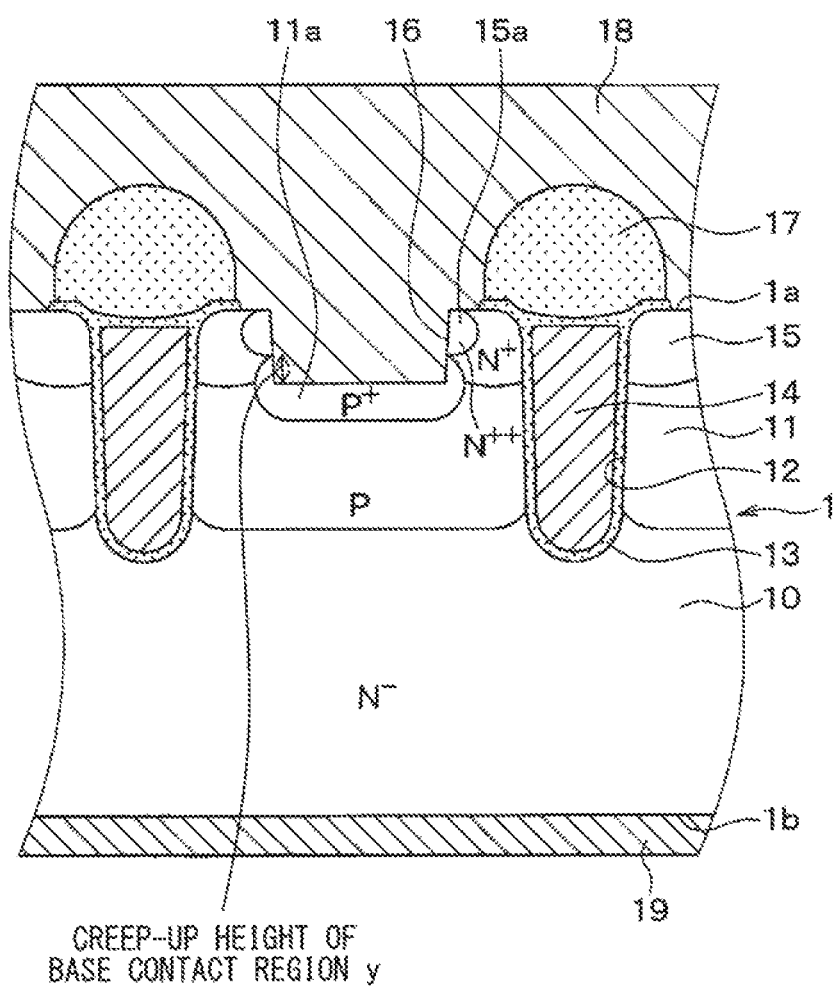
FIG. 1 is a cross-sectional view of a semiconductor device according to a first embodiment of the present disclosure.

As shown in FIG. 1, a semiconductor device has a semiconductor substrate 1 serving as an N⁻-type drift layer 10. A P-type base layer 11 that has a predetermined thickness is formed in a surface layer portion of the semiconductor substrate 1 adjacent to a surface 1a. Multiple gate trenches 12 are formed to pass through the base layer 11 and reach the drift layer 10.

Figure 2:
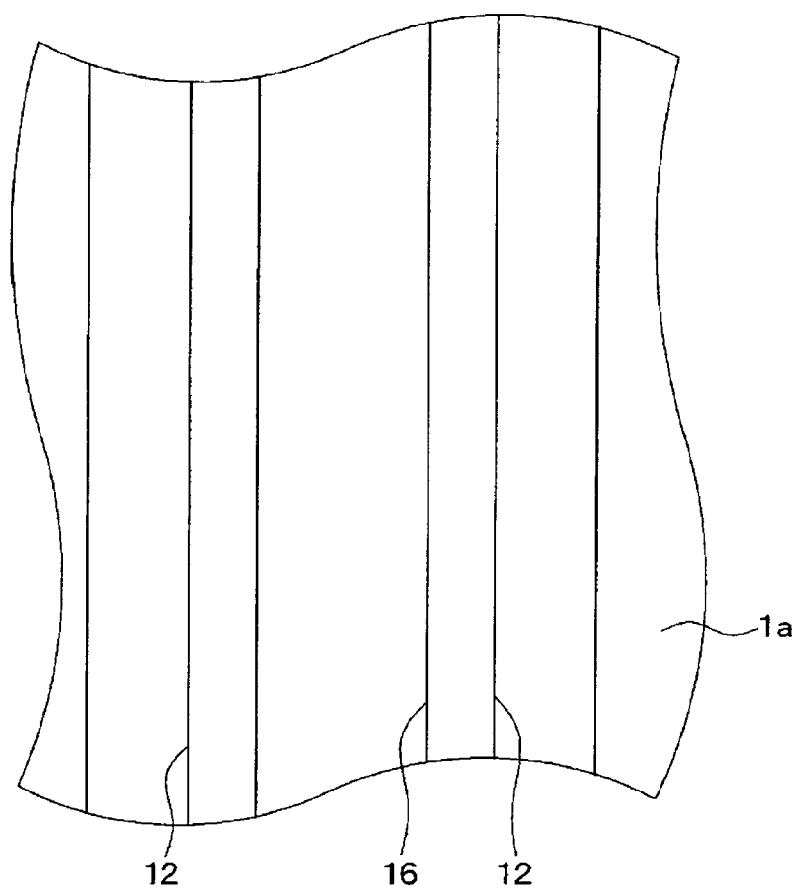
FIG. 2 is a plan view illustrating a relationship between a gate trench and a contact trench shown in FIG. 1.

As shown in FIG. 2, the gate trenches 12 extend parallel to a direction (up and down direction in FIG. 2) along the surface 1a of the semiconductor substrate 1, as a longitudinal direction. In the present embodiment, the gate trenches 12 are formed into a striped-shape. Alternatively, ends of each gate trench 12 may be connected to each other to form a loop shaped-trench.

As shown in FIG. 1, each of the gate trenches 12 is filled with a gate insulation film 13 that is disposed to cover an inner surface of the gate trench 12 and a gate electrode 14 disposed on the gate insulation film 13, thereby to form a trench gate structure.

For example, the gate insulation film 13 is made of a silicon oxide film, and the gate electrode 14 is made of a poly-silicon or the like.

An $N^+$-type source layer 15 that has a higher impurity concentration than the drift layer 10 is formed in a surface layer portion of the base layer 11. The source layer 15 is formed in the longitudinal direction of the gate trench 12 to abut on the side surface of the gate trench 12, and is ended within the base layer 11.

A contact trench 16 is formed between adjacent trench gates 12. As shown in FIGS. 1 and 2, the contact trench 16 is formed in the longitudinal direction of the gate trench 12 and shallower than the gate trench 12. Although not particularly limited, the contact trench 16 of the present embodiment is slightly deeper than the junction position between the drift layer 10 and the base layer 11.

As shown in FIG. 1, an $N^{++}$-type source contact region 15a that has a higher impurity concentration than the source layer 15 is formed to abut on a side surface of the contact trench 16 adjacent to an opening portion of the contact trench 16. In the present embodiment, the source contact region 15a is formed in the source layer 15 and in a longitudinal direction of the contact trench 16, and is ended within the source layer 15.

A $P^+$-type base contact region 11a that has a higher impurity concentration than the base layer 11 is formed to abut on the bottom surface of the contact trench 16 and the side surface of the contact trench 16 adjacent to the bottom surface. The base contact region 11a is formed from the base layer 11 to the source layer 15 and in the longitudinal direction of the contact trench 16, and is ended within the base layer 11.

The base contact region 11a of the present embodiment abuts on the source contact region 15a on the side surface of the contact trench 16. The junction position between the base contact region 11a and the source contact region 15a is disposed shallower than the junction position between the base layer 11 and the source layer 15 adjacent to the gate trench 12. In other words, the junction position between the base contact region 11a and the source contact region 15a is disposed nearer the surface 1a of the semiconductor substrate 1 than the junction position between the base layer 11 and the source layer 15 adjacent to the gate trench 12.

An interlayer insulation film 17 that is made of BPSG film or the like is formed on the gate insulation film 13 and the gate electrode 14. A source electrode 18 is formed on the interlayer insulation film 17 to fill the contact trench 16.

The source electrode 18 is connected electrically with the source contact region 15a on the surface 1a of the semiconductor substrate 1. The source electrode 18 is connected electrically with the source contact region 15a and the base contact region 11a on the wall surface of the contact trench 16. A drain electrode 19 is formed adjacent to the other surface 1b of the semiconductor substrate 1 and is connected electrically with the drift layer 10.

The semiconductor device of the present embodiment has the structure described hereinabove. In the present embodiment, $N^-$, $N^{--}$, $N^+$- and $N^{++}$-type correspond to a first conductivity-type in the present disclosure. P and $P^+$-type correspond to a second conductivity-type in the present disclosure. The base layer 11 corresponds to a semiconductor layer in the present disclosure. The source layer 15 corresponds to a second semiconductor layer in the present disclosure. The source contact region 15a corresponds to a first semiconductor region in the present disclosure. The base contact region 11a corresponds to a second semiconductor region in the present disclosure. The source electrode 18 corresponds to a first electrode in the present disclosure. The drain electrode 19 corresponds to a first electrode in the present disclosure.

A manufacturing method of the semiconductor device will be described hereinafter with reference to FIGS. 3(a) to 3(f).

As shown in FIG. 3(a), the semiconductor substrate 1 constructing the drift layer 10 is prepared. The base layer 11 is formed adjacent to the surface 1a of the semiconductor substrate 1. The source layer 15 is formed in the surface layer portion of the base layer 11. The base layer 11 and the source layer 15 are formed by ion-implanting the predetermined impurity and then conducting a thermal diffusion. In the present embodiment, the source layer 15 is formed so that the impurity concentration lowers from the surface 1a of the semiconductor substrate 1 in the thickness direction.

The trench gate structure is formed on the semiconductor substrate 1. A concrete method for manufacturing the trench gate is similar to those well-known. Although not described in detail, the gate trench 12 is formed to pass through the base layer 11 and the source layer 15 to reach the drift layer 10, and the gate insulation film 13 and the poly-silicon as the gate electrode 14 are formed on the inner surface of the gate trench 12.

Next, the BPSG film is formed on the entirety of the surface 1a of the semiconductor substrate 1 to cover the gate insulation film 13 and the gate electrode 14, thereby to form the interlayer insulation film 17.

Subsequently, as shown in FIG. 3(b), an opening portion 17a is formed to expose a region of the surface 1a of the semiconductor substrate 1 in which the contact trench 16 is to be formed by patterning the interlayer film 17 using a non-illustrated photo resist as the mask. The source contact region 15a is formed in the surface layer portion of the source layer 15 by ion-implanting a predetermined impurity using the mask and conducting the thermal diffusion.

Since the source contact region 15a is formed by conducting the thermal diffusion of the impurity, the source contact region 15a diffuses more than the region where the impurity is ion-implanted. That is, the source contact region 15a diffuses under the interlayer insulation film 17.

A border of the source contact region 15a and the source layer 15 can be made clear by forming the source contact region 15a using a different impurity from that of forming the source layer 15a. For example, P (phosphorus) can be used as the impurity for forming the source contact region 15a, in the case of using As (arsenic) as the impurity for forming the source layer 15.

As shown in FIG. 3(c), the contact trench 16 is formed to pass through the source contact region 15a and the source layer 15, and reach the base layer 11 by a dry etching using the interlayer insulation film 17 as the mask. In the present embodiment, the contact trench 16 has a tapered shape that narrows in the direction from the opening portion to the bottom surface of the contact trench 16.

The source contact region 15a that abuts on the side surface of the contact trench 16 adjacent to the opening portion of the contact trench 16 is provided by a portion of the source contact region 15a that diffuses to a position under the interlayer insulation film 17 in the step of FIG. 3(b).

Next, as shown in FIG. 3(d), the base contact region 11a described above is formed by ion-implanting the P-type impurity and conducting the thermal diffusion to the side surface of the contact trench 16 and the bottom surface of the contact trench 16 using the interlayer insulation film 17 as the mask.

Specifically, the contact trench 16 has the tapered shape that narrows in the direction from the opening portion to the bottom surface of the contact trench, and the side surface of the contact trench 16 is slanted relative to the surface 1a of the semiconductor substrate 1. Therefore, the P-type impurity is ion-implanted in a normal direction to the surface 1a of the semiconductor substrate 1.

The base contact region 11a is formed by ion-implanting the P-type impurity with a dosage larger than that for forming the base layer 11 and smaller than that for forming the source contact region 15a. Therefore, even if the impurity for forming the base contact region 11a is ion-implanted to the side surface of the contact trench 16 and the bottom surface (the entirety of the surface) of the contact trench 16, the source contact region 15a remains in the high impurity concentration area of the source contact region 15a. An interface between the source contact region 15a and the base contact region 11a is formed at a portion of the source contact region 15a where the impurity concentration is equal to that of the base contact region 11a. That is, the base contact region 11a abutting on the source contact region 15a is formed.

In the present embodiment, the source layer 15 is formed so that the impurity concentration decreases in the thickness direction from the surface 1a of the semiconductor substrate 1. Therefore, the impurity concentration of the source layer 15 adjacent to the base contact region 11a is low to restrict the impurity concentration of the source layer 15 from affecting the formation of the base contact region 11a. Similarly to the source contact region 15a, the border between the base contact region 11a and the base layer 11 can be clear by forming the base contact region 11a using a different impurity from that for forming the base layer 11. For example, Al (aluminum) can be used as the impurity for forming the base contact region 11a, in the case of using B (boron) as the impurity for forming the base layer 11.

Figure 3:
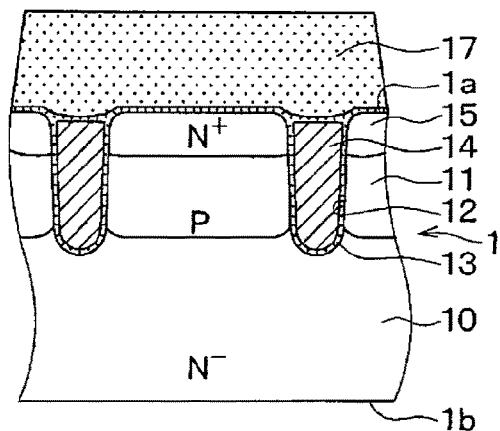
FIGS. 3(a) to 3(f) are cross-sectional views illustrating a manufacturing process of the semiconductor device shown in FIG. 1.
Figure 3:
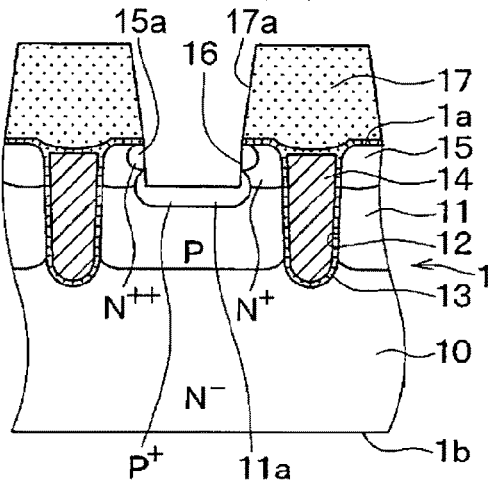
Figure 3:
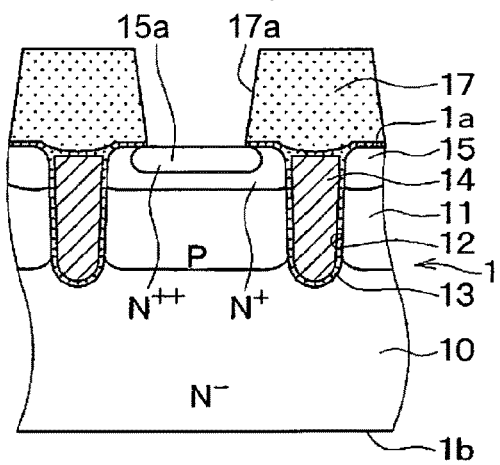
Figure 3:
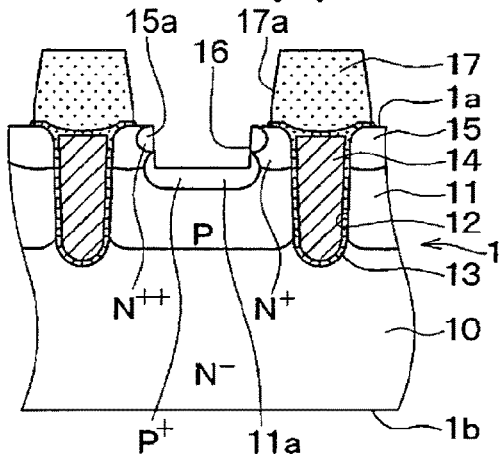
Figure 3:
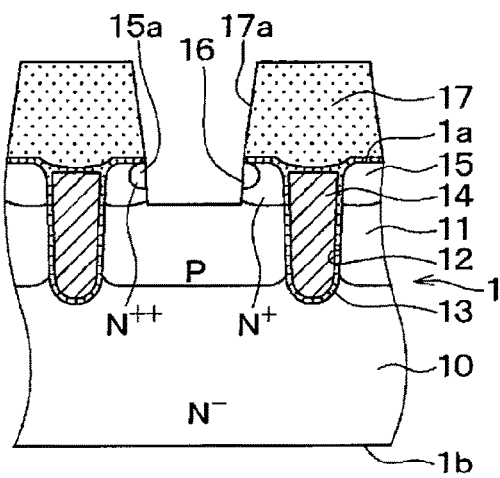
Figure 3:
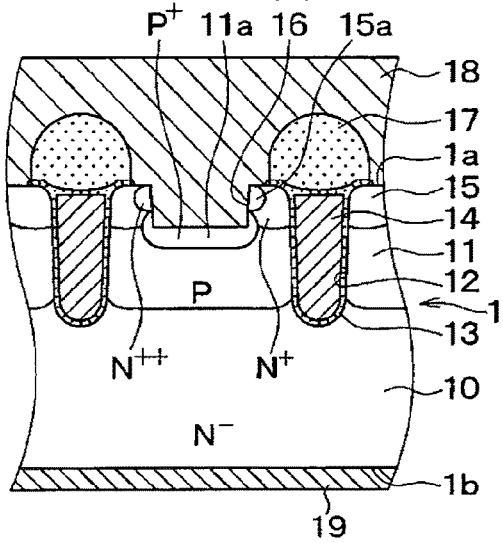

Next, as shown in FIG. 3 (e), by conducting a wet etching, the interlayer insulation film 17 and the gate insulation film 13 formed on the surface 1a of the semiconductor substrate 1 stand back and the source contact region 15a is exposed from the surface 1a of the semiconductor substrate 1.

Thereafter, as shown in FIG. 3 (f), the interlayer insulation film 17 is rounded by a reflow of the interlayer insulation film (BPSG film) 17. The source electrode 18 is formed on the interlayer insulation film 17 to be implanted in the contact trench 16. The drain electrode 19 is formed on another surface 1b of the semiconductor substrate 1. As a result, the above-described semiconductor device shown in FIG. 1 is manufactured.

The source electrode 18 is preferably formed by forming a barrier metal film such as Ti, TiN or the like on the surface 1a of the semiconductor substrate 1 and forming an Al film on the barrier metal film. Since the source electrode 18 has the barrier metal, an occurrence of Al spike is reduced.

As described above, in the present embodiment, the base contact region 11a is formed to abut on the bottom surface of the contact trench 16 and the side surface of the contact trench 16 adjacent to the bottom surface of the contact trench 16. Therefore, the size of the base contact region 11a formed on the side surface of the contact trench 16 does not change even though the semiconductor device is miniaturized by reducing the width of the contact trench 16. That is, the size of the base contact region 11a can be secured even when the semiconductor device is miniaturized. Therefore, the breakage of the semiconductor device is reduced even when the semiconductor device is connected to a load, such as a motor or a coil, having inductance and is switched from the on-state to the off-state. In other words, the load resistance of the semiconductor device can be increased.

That is, the semiconductor device described above will be turned off since the N-type channel on the gate trench 12 of the base layer 11 disappears when the semiconductor device is changed from the state where a voltage equal to or higher than a predetermined threshold is applied between the gate and the source to the state where the voltage applied between the gate and the source is equal to or lower than the predetermined threshold.

In this case, as described above, the back electromotive force occurs in the load and the diode that is formed between the drift layer 10 and the base layer 11 becomes the reverse bias state. Therefore, the breakdown occurs in the region near the gate trench 12 where electric fields are concentrated, and the electric current flows.

In this case, the electric current (carriers) flows from the breakdown region to the source electrode 18 through the base contact region 11a. In the present embodiment, however, the base contact region 11a is formed to abut on the bottom surface of the contact trench 16a and the side surface of the contact trench 16a adjacent to the bottom surface of the contact trench 16. The electric current generated by the breakdown easily flows into the base contact region 11a, so the increase of the resistance (voltage drop) in the base layer 11 can be restricted. As a result, it is less likely that the parasitic bipolar transistor will be turned on and the semiconductor device will be broken.

In the present embodiment, the source contact region 15a and the base contact region 11a abut on each other. That is, the wall surface of the contact trench 16 is surrounded by the source contact region 15a and the base contact region 11a.

The contact resistance can be lowered, as compared to the case where the source electrode 18 is in contact with the source layer 15 and the base layer 11. Since the contact resistance with the source electrode 18 can be lowered, the contact trench 16 needs not to be deepen in order to increase the contact area of the contact trench 16 with the source electrode 18. It is less likely that the depletion layer between the drift layer 10 and the base layer 11 will reach the contact trench 16 and the voltage resistance will decrease.

The junction position between the base contact region 11a and the source contact region 15a is disposed shallower than the junction position between the base layer 11 and the source layer 15 adjacent to the gate trench 12. Therefore, the contact trench 16 can be shallower and the source electrode 18 can be implanted easily in the contact trench 16.

In the present embodiment, the same interlayer insulation film 17 is used as the mask for the ion-implantation for forming the source contact region 15a, the mask for the ion-implantation for forming the contact trench 16, the mask for the ion-implantation for forming the base contact region 11a. Therefore, an occurrence of misalignment can be reduced, as compared to the case using a different mask in each step.

In the present embodiment, the source layer 15 is formed so that the impurity concentration decreases in the thickness direction from the surface 1a of the semiconductor substrate 1. Therefore, the impurity concentration of the source layer 15 adjacent to the base contact region 11a is low to restrict the impurity concentration of the source layer 15 from affecting the formation of the base contact region 11a. As a result, the manufacturing process of the semiconductor device can be simplified.

(Second Embodiment)

A second embodiment of the present disclosure will be hereinafter described. In the present embodiment, the shape of the gate trench 12 and the contact trench 16 are changed from those of the first embodiment. Other contents are similar to those of the first embodiment, and descriptions thereof will be omitted.

Figure 4:
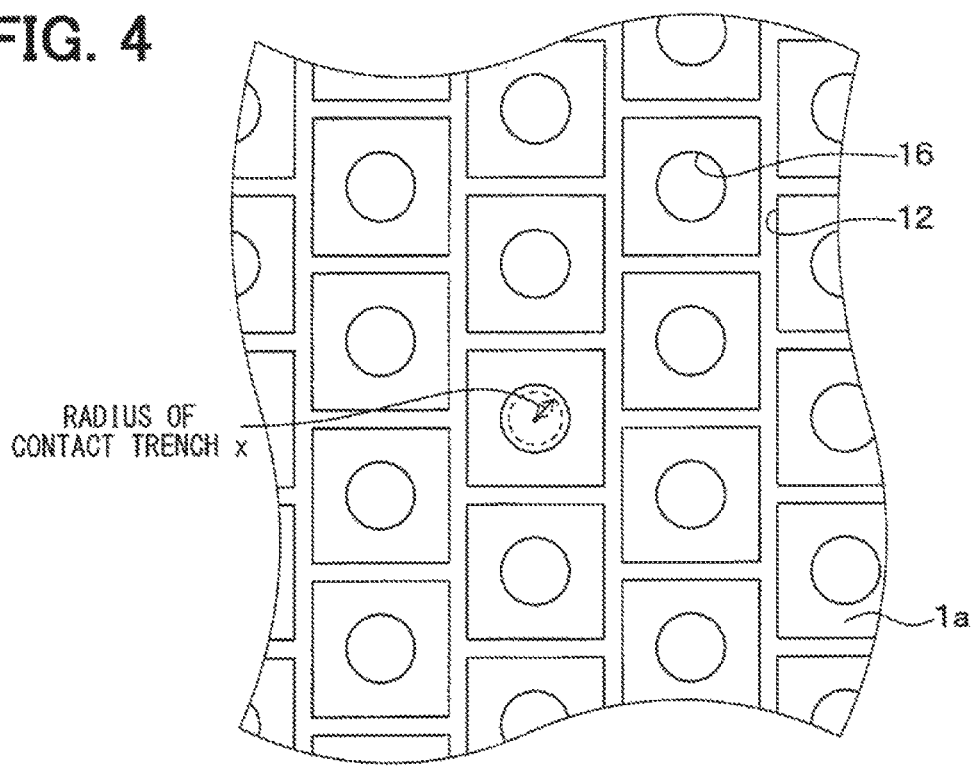
FIG. 4 is a plan view illustrating a relationship between a gate trench and a contact trench according to a second embodiment of the present disclosure.

The basic structure of the semiconductor device in the present embodiment is similar to that of the first embodiment. As shown in FIG. 4, however, the gate trench 12 is formed in a ladder shape. That is, in the present embodiment, the semiconductor device has a so-called mesh cell. The contact trench 16 is formed in the region surrounded by the gate trench 12, and has a circular (perfect circular) bottom. The perimeter of the side surface of the contact trench 16 adjacent to the bottom surface of the contact trench 16 abuts on the base contact region 11a. The creep-up height of the base contact region 11a abutting on the side surface of the contact trench 16 (hereinafter referred to as the creep-up height of the base contact region 11a) is defined as follows. The creep-up height of the base contact region 11a abutting on the side surface of the contact trench 16 is, in other words, a length of the base contact region 11a that abuts on the side surface of the contact trench 16 in the direction from the bottom surface of the contact trench 16 to the opening portion of the contact trench 16.

Figure 5:
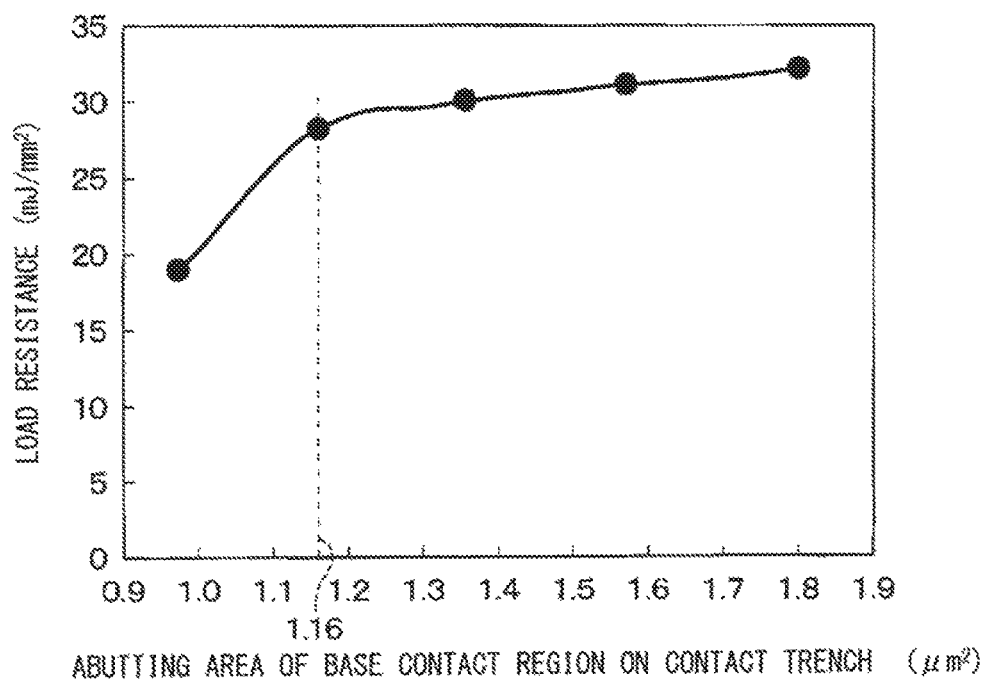
FIG. 5 is a graph illustrating a relationship between the area of a base contact region abutting on a contact trench and a load resistance.

The load resistance depends on the area of the base contact region 11a abutting on the contact trench 16. Specifically, as shown in FIG. 5, the load resistance decreases steeply when the area of the base contact region 11a abutting on the contact trench 16 is equal to or less than 1.16 $\mu m^2$. Therefore, the area of the base contact region 11a abutting on the contact trench 16 is preferably equal to or greater than 1.16 $\mu m^2$.

Figure 6:
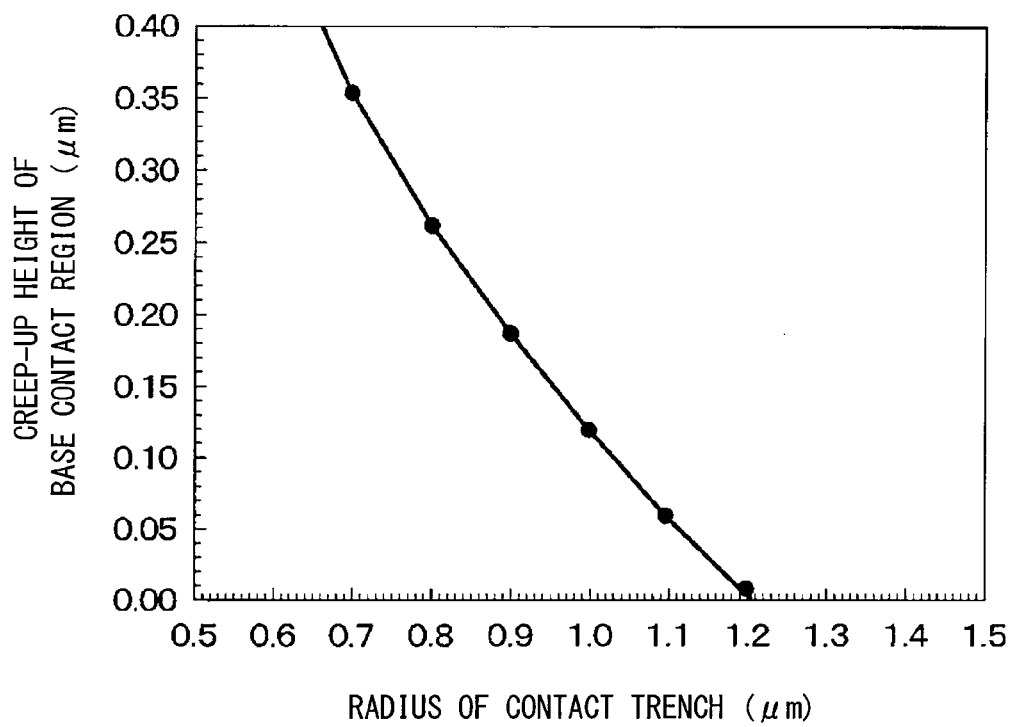
FIG. 6 is a graph illustrating a relationship between a radius of the contact trench and a creep-up height of the base contact region, when the area of the base contact region abutting on the contact trench is 1.16 $\mu m^2$.

In this case, as shown in FIG. 6, the creep-up height of the base contact region 11a is defined as y [$\mu m$] and the radius of the contact trench 16 is defined as x [$\mu m$]. When a relation of $y \geq -x/4 + 0.37/x$ is satisfied, the area of the base contact region 11a abutting on the contact trench 16 is equal to or greater than 1.16 $\mu m^2$. Therefore, the base contact region 11a and the contact trench 16 are formed to satisfy the relation of $y \geq -x/4 + 0.37/x$.

Figure 7:
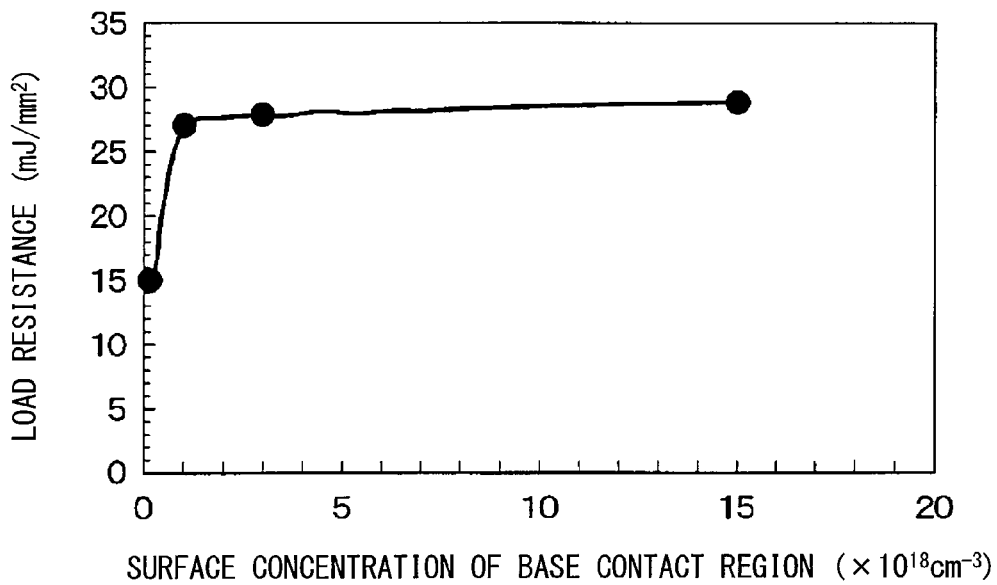
FIG. 7 is a graph illustrating a relationship between the surface concentration of the base contact region and the load resistance.

As shown in FIG. 7, the load resistance decreases steeply when the surface concentration of the base contact region 11a (concentration of the portion that abuts on the bottom surface of the contact trench 16) is less than $1.0 \times 10^{18}$ cm$^{-3}$. Therefore, the surface concentration of the base contact region 11a is equal to or greater than $1.0 \times 10^{18}$ cm$^{-3}$.

In the present embodiment, the base contact region 11a is formed to have the surface concentration equal to or greater than $1.0 \times 10^{18}$ cm$^{-3}$, and to satisfy the relation of $y \geq -x/4 + 0.37/x$.

As described above, in the present embodiment, the base contact region 11a is formed to have the surface concentration equal to or greater than $1.0 \times 10^{18}$ cm$^{-3}$, and to satisfy the relation of $y \geq -x/4 + 0.37/x$. Therefore, more stable load resistance and the similar effect as described in the first embodiment can be achieved.

(Third Embodiment)

A third embodiment will be hereinafter described. In the present embodiment, the gate insulation film 13 is formed partially thicker than that of the first embodiment. The other contents are similar to those of the first embodiment, and descriptions thereof will be omitted.

Figure 8:
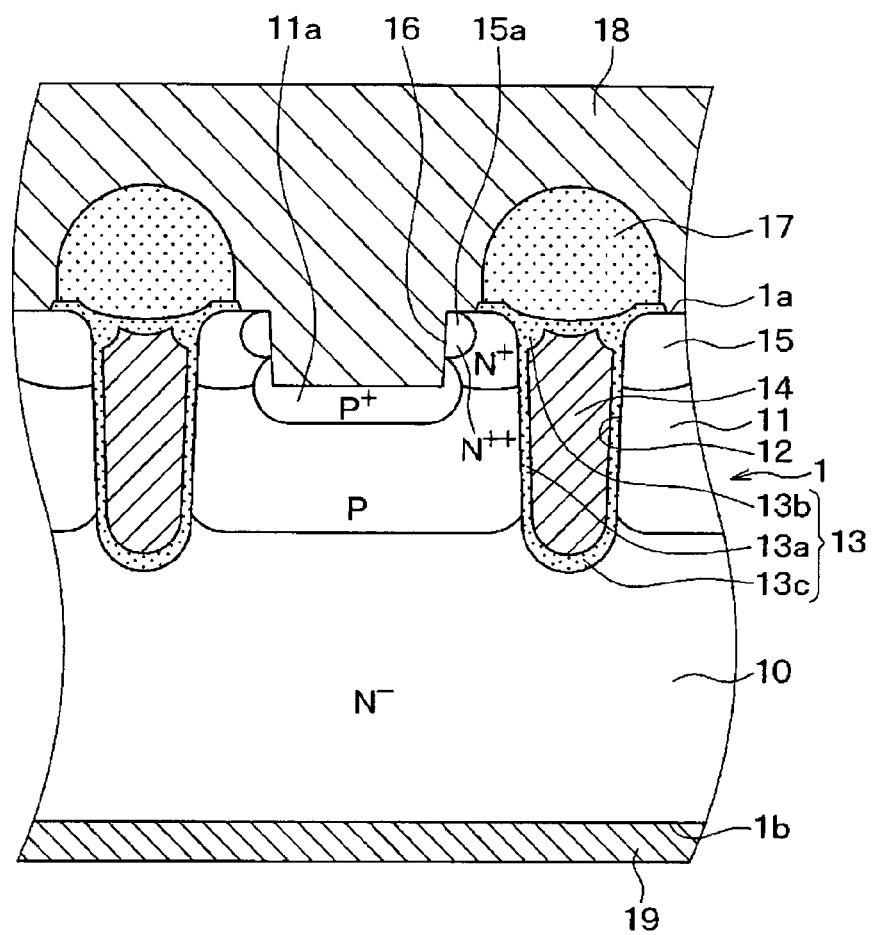
FIG. 8 is a cross-sectional view of a semiconductor device according to a third embodiment of the present disclosure.

As shown in FIG. 8, in the present embodiment, the gate insulation film 13 includes a side gate insulation film 13a on the side surface of the gate trench 12, an opening gate insulation film 13b on the opening portion of the gate trench 12, and a bottom gate insulation film 13c on the bottom surface of the gate trench 12.

The opening gate insulation film 13b and the bottom gate insulation film 13c are formed thicker than the side gate insulation film 13a. For example, the side gate insulation film 13a is formed by laminating a silicon oxide film, a silicon nitride film and another silicon oxide film in order.

The source layer 15 is formed to the depth where the thickness of the gate insulation film 13 is fixed in order to restrict the threshold voltage forming an inversion layer in the base layer 11 from increasing.

In the semiconductor device that can ease the electrical field on a periphery of the gate trench 12 by the silicon nitride film, the opening gate insulation film 13b and the bottom gate insulation film 13c, the similar effect described in the first embodiment can be achieved by employing the present disclosure.

(Other Embodiments)

The present disclosure is not limited in the above embodiments and can be modified suitably within the scope described in claims.

For example, in the first embodiment, the first conductivity-type is the N-type and the second conductivity-type is the P-type. Alternatively, the first conductivity-type may the P-type and the second conductivity-type may be the N-type.

In the embodiments described above, an example in which the present disclosure is employed to MOSFET is described. Alternatively, the present disclosure may be employed to IGBT forming the P$^+$-type collector layer on the other surface 1b of the semiconductor substrate 1.

In the embodiments described above, an example in which the present disclosure is employed to the semiconductor device where the electric current flows in the thickness direction of the semiconductor substrate 1 is described. Alternatively, the present disclosure may be employed to the semiconductor device where the drain electrode 19 is formed adjacent to the surface 1a of the semiconductor substrate 1 and the electric current flows in a direction along the surface of the semiconductor substrate 1.

Figure 9:
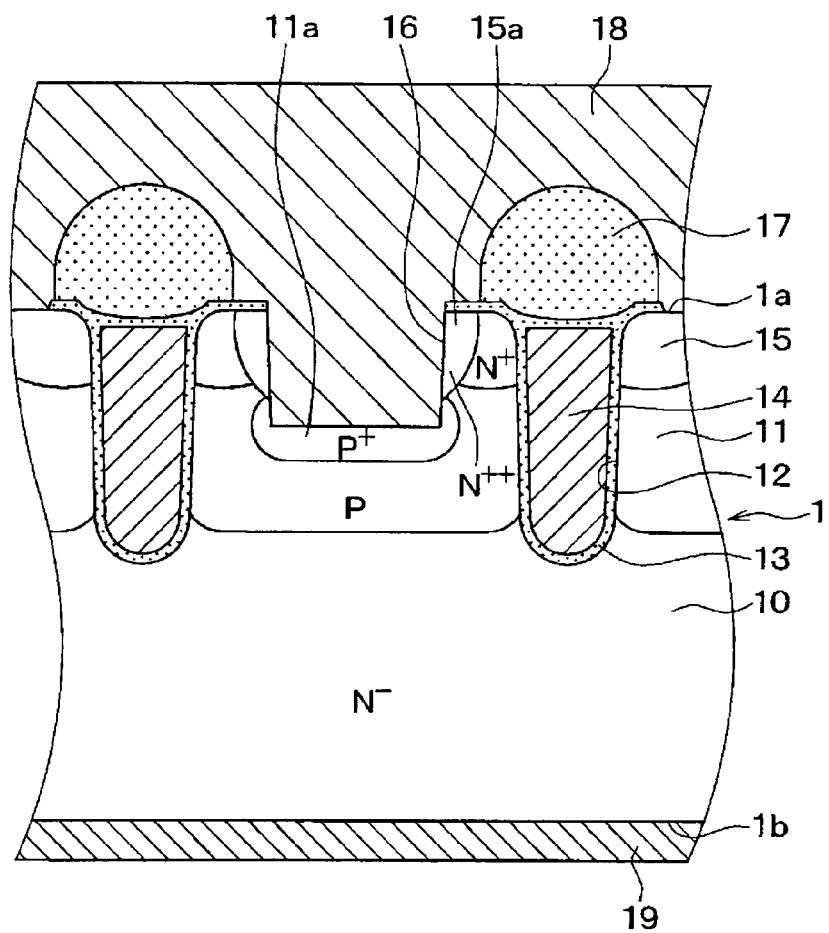
FIG. 9 is a cross-sectional view of a semiconductor device according to another embodiment of the present disclosure.

In the embodiments described above, as shown in FIG. 9, the junction position between the base contact region 11a and the source contact region 15a may be disposed deeper than the junction position between the base layer 11 and the source layer 15 adjacent to the gate trench 12. That is, the junction position between the base contact region 11a and the source contact region 15a may be disposed more adjacent to the other surface 1b of the semiconductor substrate 1 than the junction position between the base layer 11 and the source layer 15 adjacent to the gate trench 12. In this case, since the contact area of the source contact region 15a with the source electrode 18 increases, the on-state resistance will be reduced. That is, the relationship between the junction position between the base contact region 11a and the source contact region 15a and the junction position between the base layer 11 and the source layer 15 can be changed suitably according to an application.

Figure 10:
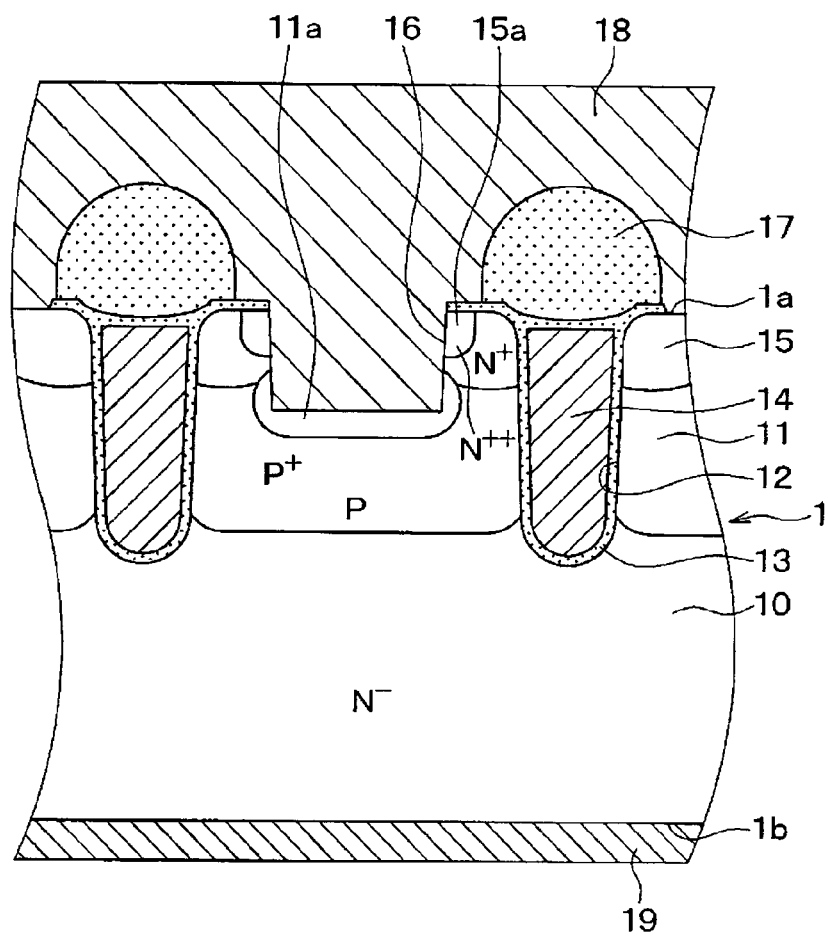
FIG. 10 is a cross-sectional view of a semiconductor device according to another embodiment of the present disclosure.

In the embodiments described above, as shown in FIG. 10, it is not always necessary that the base contact region 11a abuts on the source contact region 15a. The effect of the present disclosure can be achieved as long as the base contact region 11a abuts on the bottom surface of the contact trench 16 and the side surface of the contact trench adjacent to the bottom surface of the contact trench 16.

In the embodiments described above, a portion between the bottom surface of the contact trench 16 and the side surface of the contact trench 16 may be rounded.

In the embodiments described above, an example in which the gate trench 12 has the tapered shape that narrows from the opening portion of the contact trench 16 to the bottom surface of the contact trench 16 is described. Alternatively, the width of the gate trench 12 from the opening portion of the contact trench 16 to the bottom surface of the contact trench 16 may be fixed. In this case, during the ion-implanting for forming the base contact region 11a shown in FIG. 3(d), the ion-implanting is conducted while inclining by a predetermined angle relative to the surface 1a of the semiconductor substrate 1, and hence the impurity may be ion-implanted to the side surface of the contact trench 16 and the bottom surface of the contact trench (the entirety of the wall surface).

During the ion-implanting for forming the base contact region 11a shown in FIG. 3(d), the impurity may be ion-implanted only to the bottom surface of the contact trench 16. In this case, the conditions of conducting the thermal diffusion may be controlled suitably so that the base contact region 11a abuts on the side surface of the contact trench 16 adjacent to the bottom surface of the contact trench 16.

Figure 11:
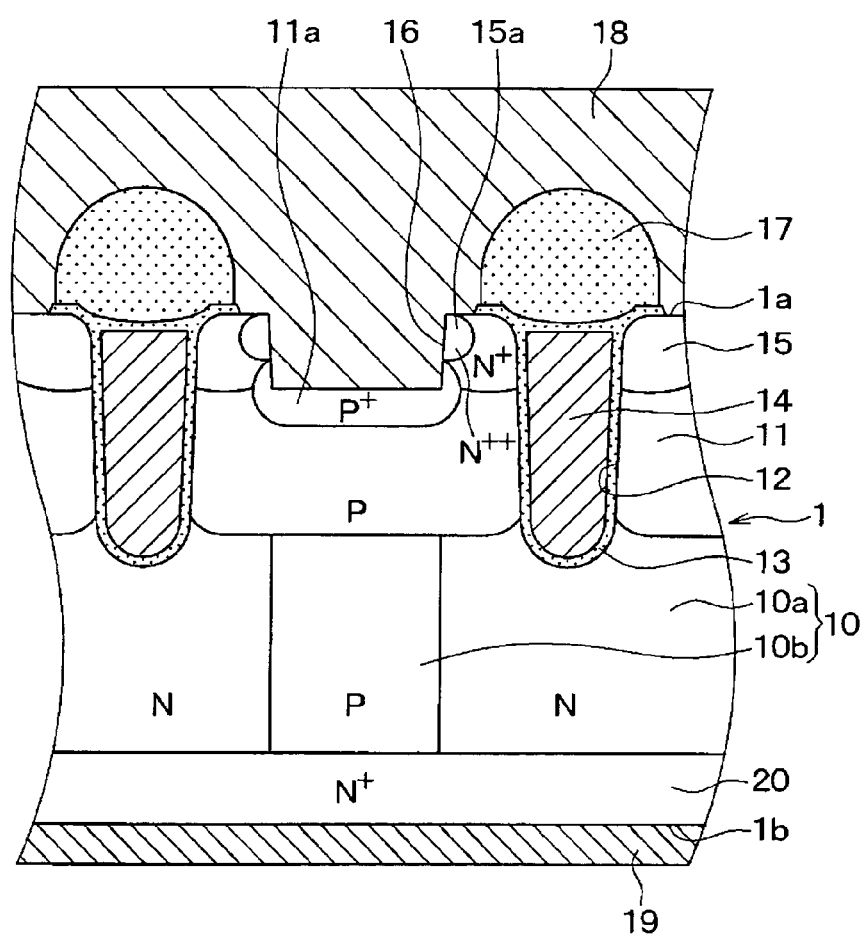
FIG. 11 is a cross-sectional view of a semiconductor device according to another embodiment of the present disclosure.

As shown in FIG. 11, the present disclosure may be employed to a semiconductor device having the semiconductor substrate 1 having a super junction structure in which an N-type region 10a and a P-type region 10b are disposed alternately and repeatedly on an N$^+$-type substrate 20.

Figure 12:
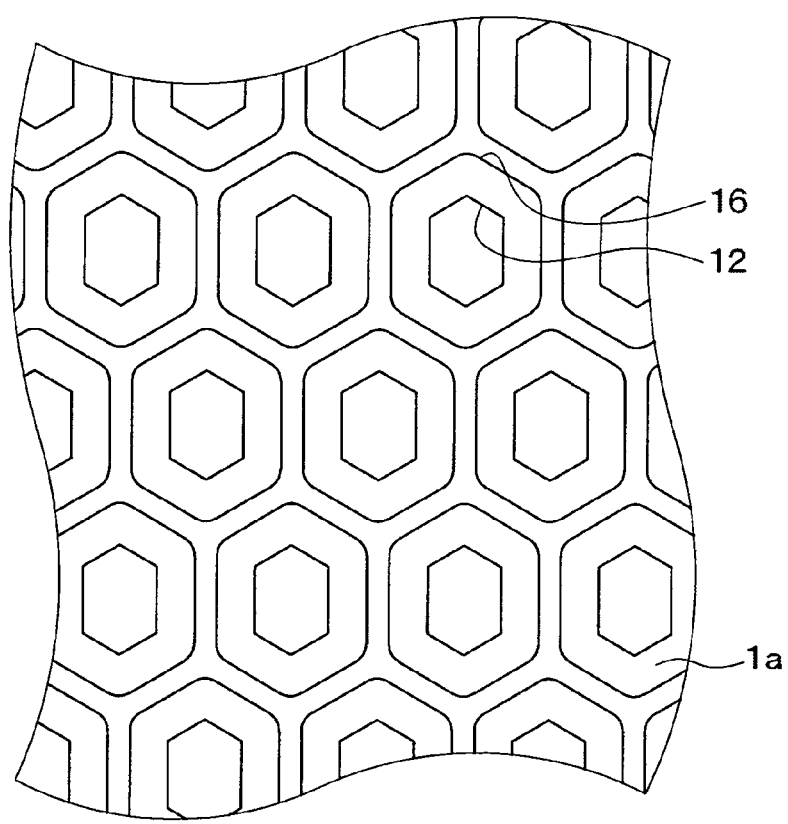
FIG. 12 is a plan view illustrating a relationship between a gate trench and a contact trench according to another embodiment of the present disclosure.

As shown in FIG. 12, in a planar shape, the gate trench 12 may have a hexagonal lattice-like shape and the bottom surface (opening portion) of the contact trench 16 may have a hexagonal shape.

Figure 13:
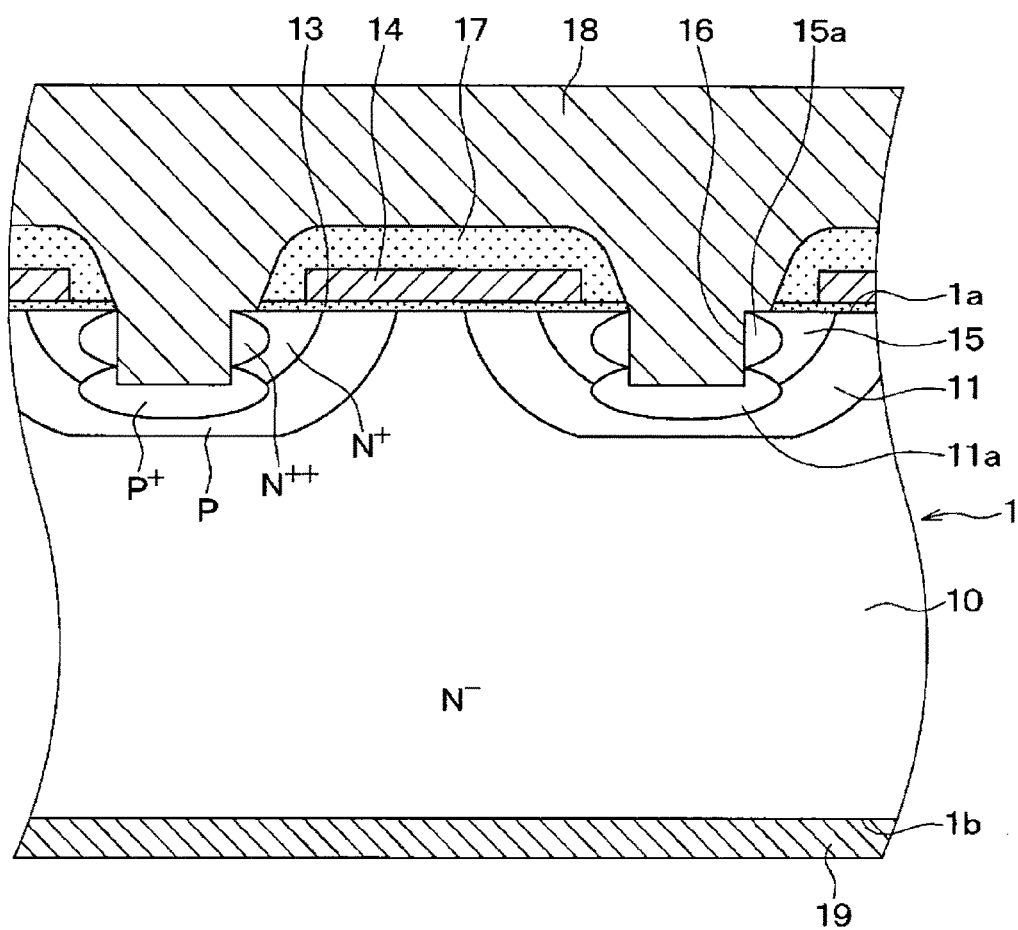
FIG. 13 is a cross-sectional view of a semiconductor device according to another embodiment of the present disclosure.

The present disclosure may be employed to a semiconductor device without the trench gate structure. That is, the present disclosure may be employed to a planar-type semiconductor device as shown in FIG. 13. Specifically, multiple base layers 11 are formed to be separated mutually in the surface layer portion adjacent to the surface 1a of the semiconductor substrate 1 serving as the drift layer 10. The source layer 15 is formed in the surface layer portion of the base layer 11 and the contact trench 16 is formed in the source layer 15.

The source contact region 15a is formed to abut on the side surface of the contact trench 16 adjacent to the opening portion of the contact trench 16. The base contact region 11a is formed to abut on the bottom surface of the contact trench 16 and the side surface of the contact trench 16 adjacent to the bottom surface of the contact trench 16.

The gate insulation film 13 is formed on the surface 1a of the semiconductor substrate 1, and the gate electrode 14 is formed on the gate insulation film 13. The interlayer insulation film 17 is formed to cover the gate electrode 14, and the source electrode 18 is formed on the interlayer insulation film 17 to be implanted in the contact trench 16.

Also in the semiconductor device, since the base contact region 11a is formed to abut on the bottom surface of the contact trench 16 and the side surface of the contact trench adjacent to the bottom surface of the contact trench 16, the semiconductor will be restricted to be broken. That is, the load resistance of the semiconductor device can be increased.

In the present disclosure, forming the base contact region 11a to abut on the bottom surface of the contact trench 16 and the side surface of the contact trench 16 adjacent to the bottom surface of the contact trench 16 can be understood as that the base contact region 11a defines the bottom surface of the contact trench 16 and the side surface of the contact trench 16 adjacent to the bottom surface of the contact trench 16. Forming the source contact region 15a to abut on the side surface of the contact trench 16 adjacent to the opening portion of the contact trench 16 can be understood as that the source contact region 15a defines the side surface of the contact trench 16 adjacent to the opening portion of the contact trench 16. In other words, the bottom surface of the contact trench 16 and the side surface of the contact trench 16 adjacent to the bottom surface of the contact trench 16 is provided by the base contact region 11a, and the side surface of the contact trench 16 adjacent to the opening portion of the contact trench 16 are provided by the source contact region 15a. The perimeter of the side surface of the contact trench 16 adjacent to the bottom surface of the contact trench 16 entirely abutting on the base contact region 11a can be understood as that the perimeter of the side surface of the contact trench 16 adjacent to the bottom surface of the contact trench 16 is provided by the base contact region 11a.

While only the selected exemplary embodiments have been chosen to illustrate the present disclosure, the present disclosure is not limited to the said embodiments and structures. Various changes and modification can be made in the present disclosure. Furthermore, various combination and formation, and other combination and formation including one, more than one or less than one element can be made in the present disclosure.

The invention claimed is:
1. A semiconductor device comprising:
a first conductivity-type drift layer;
a second conductivity-type first semiconductor layer disposed in a surface layer portion of the drift layer;
a first conductivity-type second semiconductor layer disposed in a surface layer portion of the first semiconductor layer;
a contact trench disposed in the second semiconductor layer;
a first conductivity-type first semiconductor region abutting on a side surface of the contact trench adjacent to an opening portion of the contact trench and having a higher impurity concentration than that of the second semiconductor layer;
a second conductivity-type second semiconductor region abutting on a bottom surface of the contact trench and a side surface of the contact trench adjacent to the bottom surface of the contact trench and having a higher impurity concentration than that of the first semiconductor layer;
a first electrode disposed in the contact trench and connected electrically with the first semiconductor region and the second semiconductor region; and
a second electrode connected electrically with a region different from a region to which the first electrode is electrically connected and allowing a current to flow between the first electrode and the second electrode,
wherein the first semiconductor region and the second semiconductor region abut on each other,
wherein a junction position between the first semiconductor region and the second semiconductor region is disposed shallower than a junction position between the first semiconductor layer and the second semiconductor layer.

2. The semiconductor device according to claim 1, wherein the bottom surface of the contact trench has a circular shape.

3. The semiconductor device according to claim 2, wherein
the second semiconductor region abuts on a perimeter of the side surface of the contact trench adjacent to the bottom surface of the contact trench,
a concentration of a portion of the second semiconductor region abutting on the bottom surface of the contact trench is equal to or greater than $1.0 \times 10^{18} [cm^{-3}]$,
a radius of the circular shape of the bottom surface of the contact trench is defined as x [μm],
a length of a portion of the second semiconductor region, abutting on the side surface of the contact trench adjacent to the bottom surface of the contact trench, in a direction from the bottom surface of the contact trench to the opening portion of the contact trench is defined as a creep-up height of the second semiconductor region, and
the creep-up height of the second semiconductor region is equal to or greater than $-x/4+0.37/x$.

4. The semiconductor device according to claim 1, wherein the bottom surface of the contact trench has a hexagonal shape.

5. The semiconductor device according to claim 1, comprising:
a plurality of gate trenches passing through the first semiconductor layer to reach the drift layer;
a gate insulation film disposed on a wall surface of each of the plurality of the gate trenches; and
a gate electrode disposed on each gate insulation film.

6. The semiconductor device according to claim 1, wherein
the junction position between the first semiconductor region and the second semiconductor region is a position at which the first semiconductor region and the second semiconductor region abut on each other.

* * * * *